United States Patent

Jeng et al.

[11] Patent Number: 6,114,186
[45] Date of Patent: *Sep. 5, 2000

[54] HYDROGEN SILSESQUIOXANE THIN FILMS FOR LOW CAPACITANCE STRUCTURES IN INTEGRATED CIRCUITS

[75] Inventors: Shin-Puu Jeng, Plano; Kelly J. Taylor, Allen; Amitava Chatterjee, Plano, all of Tex.

[73] Assignee: Texas Instruments Incorporated, Dallas, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/893,653

[22] Filed: Jul. 11, 1997

Related U.S. Application Data

[60] Provisional application No. 60/023,133, Jul. 30, 1996.

[51] Int. Cl.$^7$ .................................................. H01L 21/4763
[52] U.S. Cl. .......................... 438/62.3; 438/624; 438/780; 438/781; 438/902
[58] Field of Search ..................... 257/788, 752; 438/623, 624, 780, 781, 902

[56] References Cited

U.S. PATENT DOCUMENTS 4,756,977 7/1988 Haluska et al. .
5,145,723 9/1992 Ballance et al. .......................... 427/397
5,158,904 10/1992 Leda ........................................ 438/290
5,506,177 4/1996 Kishimoto et al. ...................... 437/195
5,530,293 6/1996 Cohen et al. ............................ 257/752
5,549,934 8/1996 Garza et al. ............................. 427/489
5,567,660 10/1996 Chen et al. .............................. 438/763
5,604,380 2/1997 Nishimura et al. ..................... 257/758
5,750,403 5/1998 Inoue et al. ............................. 438/787

FOREIGN PATENT DOCUMENTS 0 715 354 6/1996 European Pat. Off. .
WO 91/19317 12/1991 WIPO .
WO 94/01885 1/1994 WIPO .

*Primary Examiner*—Richard Booth
*Assistant Examiner*—David A. Zarneke
*Attorney, Agent, or Firm*—Bret J. Petersen; Frederick J. Telecky, Jr.

[57] ABSTRACT

An improved method is provided for integrating HSQ into integrated circuit structures and processes, especially those requiring multiple levels of interconnect lines. In a preferred embodiment, interconnect lines 14 are first patterned and etched on a substrate 10. A low-k material such as hydrogen silsesquioxane (HSQ) 18 is spun across the surface of the wafer to fill areas between interconnect lines. A capping layer such as SiO$_2$ 20 is applied to on top of the low-k material. The HSQ is then heated to cure. A thick SiO$_2$ planarization layer 22 may then be applied and planarized. In other embodiments, the HSQ and SiO$_2$ process steps can be repeated for multiple layers of HSQ.

17 Claims, 2 Drawing Sheets

HYDROGEN SILSESQUIOXANE THIN FILMS FOR LOW CAPACITANCE STRUCTURES IN INTEGRATED CIRCUITS

CROSS-REFERENCES TO RELATED APPLICATIONS

This application claims priority under 35 U.S.C. §119(e)(1) of provisional application No. 60/023,133, filed Jul. 30, 1996.

The following co-assigned previously filed applications are related to the instant application and are incorporated herein by reference.

| Application | TI Case | Filing Date | Title |
|---|---|---|---|
| S/N 08/137,658 | TI-18509 | 10/15/93 | Planarized Structure for Line-Line Capacitance Reduction |
| S/N 08/298,807 | TI-19532 | 08/03/94 | Improving Interconnect Capacitance Between Metal Leads |
| S/N 08/455,765 | TI-18929AA | 05/31/95 | A Planarized Multi-Level Interconnect Scheme With Embedded Low-Dielectric Constant Insulators |
| S/N 60/005132 | TI-20784 | 10/12/95 | A Low Capacitance Interconnect Structure For Integrated Circuits |
| S/N 60/007,053 | TI-21907 | 10/25/95 | Highly Thermally Conductive Interconnect Structure |
| S/N 60/007,910 | TI-21909 | 12/04/95 | A Low Capacitance Interconnect Structure For Integrated Circuits Using Decomposed Polymers |
| S/N 60/013,866 | TI-21880 | 03/22/96 | Low Capacitance Interconnect Structures in Integrated Circuits Using a Stack of Low Dielectric Materials |
| S/N 60/023,128 | TI-19738 | 07/30/96 | Mesa Isolation Refill Process For Silicon On Insulator Technology Using Flowable Oxides As The Refill Material |

FIELD OF THE INVENTION

This invention generally relates to methods and structures for reducing capacitance in integrated circuits such as between closely spaced interconnect lines or in silicon trench isolation. More particularly, it relates to a method of suppressing cracks during cure of Hydrogen Silsesquioxane's (HSQ) thin films to obtain an immunity to high temperature processes and increase the porosity and reduce the dielectric constant of the HSQ.

BACKGROUND OF THE INVENTION

Integrated circuits increasingly require very close spacing of interconnect lines and many now require multiple levels of metalization, as many as seven, to interconnect the various circuits on the device. Since closer spacing increases capacitance between adjacent lines, as the device geometries shrink and densities increase capacitance and cross talk between adjacent lines becomes more of a problem. Therefore, it becomes increasingly more desirable to use materials with lower dielectric constants to offset this trend and thereby lower capacitance between closely spaced interconnects.

Interconnect capacitance is a distributed quantity in the metalization, however, two components dominate: the line-to-substrate, or line-to-ground capacitance and line-to-line capacitance. For ultra large scale integration at 0.25 micron design rules and beyond, performance is dominated by interconnect RC delay, with line-to-line capacitance being the dominant contributor to total capacitance. For example, theoretical modeling has shown that when the width/spacing is scaled down below 0.3 micron, the interlayer capacitance is so small that total capacitance is dictated by the line-to-line capacitance, which constitutes more than 90% of the total interconnect capacitance. Therefore, a reduction of the line-to-line capacitance alone will provide a dramatic reduction in total capacitance.

The intermetal dielectric (IMD) of the prior art is typically $SiO_2$ which has a dielectric constant of about 4.0. It would be desirable to replace this material with a material having a lower dielectric constant. As used herein, low dielectric constant or low-k means a material having a dielectric constant of lower than about 3.5 and preferably lower than 3 and most preferably about 2 or lower. Unfortunately, materials having a lower dielectric constant have characteristics that make them difficult to integrate into existing integrated circuit structures and processes. Many polymeric materials such as polysilsesquioxane, parylene, polyimide, benzocyclobutene and amorphous Teflon have lower dielectric constants (lower permittivities). Other preferred materials are Aerogel or Xerogel which are typically made from a gelation of tetraethoxysilane (TEOS) stock solution. Compared to $SiO_2$, these preferred low-k materials typically have low mechanical strength, poor dimensional stability, poor temperature stability, high moisture absorption and permeation, poor adhesion, large thermal expansion coefficient and an unstable stress level. Because of these attributes, the use of polymer or other low dielectric materials as a stand alone replacement for $SiO_2$ in integrated circuit processes or structures is very problematic.

An earlier application, by applicant herein, Ser. No. 60/013,866 (TI-21880) disclosed a method and structure for integrating HSQ and other low dielectric constant materials. This application discloses creating a multilayer dielectric stack of alternating layers of low-k materials and traditional dielectrics. The more fragile low-k material is ruggedized by a stabilizing layer inserted between layers of low-k films.

Another previous co-assigned application, Ser. No. 60/ (TI-19738) disclosed a method and structure for integrating HSQ into mesa isolation structures.

SUMMARY OF THE INVENTION

The present invention provides an improved method for integrating low dielectric constant materials, which may have undesirable properties such as those discussed above, into integrated circuit structures and processes, especially those requiring multiple levels of interconnect lines. The present invention is particularly concerned with improving the mechanical strength and crack resistance of low-k films such as hydrogen silsesquioxane (HSQ).

It has been observed previously that crack formation in HSQ can be affected by factors such as cure temperature, cure ambient, set-time before cure, and film thickness. Some success at crack suppression has been obtained by controlling these conditions. Disclosed herein is a method for further reducing cracks in HSQ by rearranging the process steps of prior art methods to achieve a more robust fabrication process and thicker HSQ layers which are substantially crack free. In general, the process of the present invention is to overcoat the HSQ with a permeable and mechanically stable thin film prior to curing.

In a preferred embodiment, interconnect lines are first patterned and etched. A low-k material such as hydrogen silsesquioxane (HSQ) is spun across the surface of the wafer to fill areas between interconnect lines. The HSQ may be advantageously thicker than achievable in prior art structures. A dielectric stabilizing cap layer such as $SiO_2$ is then applied to on top of the HSQ. The HSQ is then heated on a hot plate to cure. A thick $SiO_2$ planarization layer may then be applied and planarized. In other embodiments, the HSQ and $SiO_2$ process steps can be repeated for multiple layers of HSQ.

An advantage of the present invention is that no additional process steps are added compared to existing HSQ processes. The process steps are essentially rearranged in sequence, therefore there is no additional costs for the added benefits of the new process.

An additional advantage of this invention is high temperature (>450 Celsius) processes can be used subsequent to HSQ application. For example, high temperature furnace cures, such as oxide densification and reflow, are now possible to improve the integrity of the dielectric.

Another advantage is $O_2$ and $H_2O$ cures can now be used to 'heal' the oxide prior to subsequent processing.

Further, oxygen plasma ashing can now be used with impunity, if needed, since HSQ will be protected from the plasma by the cap layer. Also, the present invention may be combined with the methods of the above referenced applications.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

The preferred embodiments of the present invention are best understood by referring to FIGS. 1–4 of the drawings, like numerals are used for like and corresponding parts of the various drawings.

Figure 1:
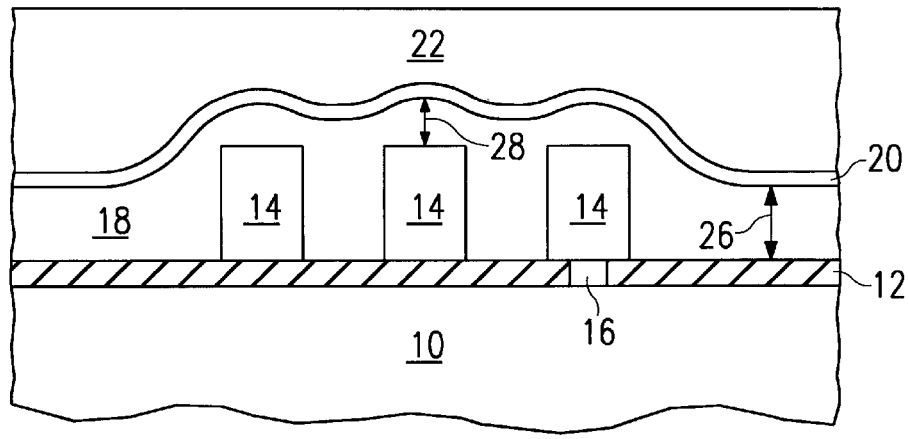
FIG. 1 Represents a cross-sectional view of a preferred embodiment of the present invention.

With reference to FIG. 1, there is shown an embodiment of the present invention, wherein HSQ 18 is deposited between interconnect lines 14 on a semiconductor substrate 10. The HSQ may be applied by one of several methods known in the art and by those listed in the above referenced applications. A thin dielectric cap layer or stabilizing layer 20 covers the HSQ layer. The cap layer may then be followed by additional low-k material layers. The intermetal region may then be completed with a planarized intermetal dielectric layer 22.

Figure 2A:
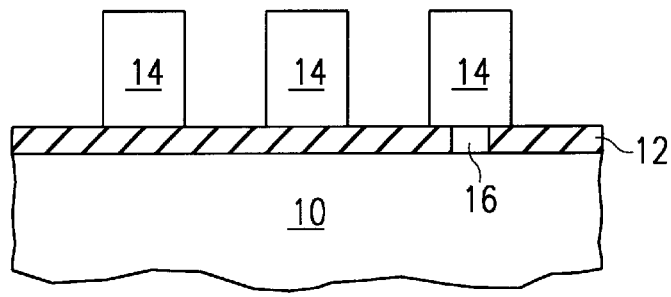
FIGS. 2a–c Shows the steps to fabricate the preferred embodiment of FIG. 1.
Figure 2B:
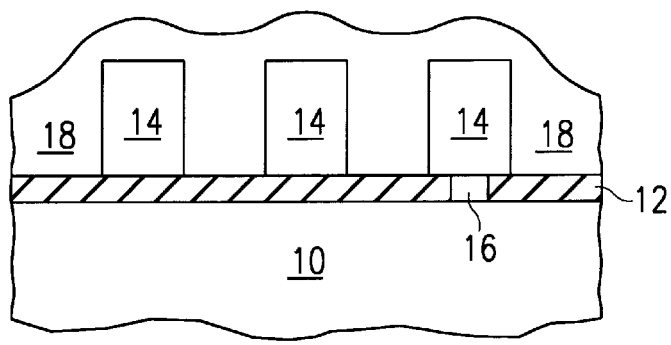
Figure 2C:
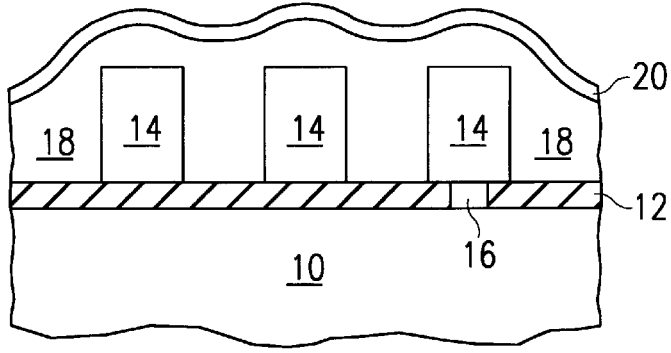

With reference to FIGS. 2a–2b, there is shown a sequence of steps for forming an embodiment of the present invention which is represented by the completed structure shown in FIG. 1. FIG. 2a illustrates a semiconductor substrate 10 covered with a layer of dielectric 12. The illustrated embodiment of the present invention is directed to reducing capacitance between interconnections on an integrated circuit. Since these interconnections are typically located over the top of active devices fabricated on the surface of a wafer of semiconducting material such as silicon crystal, semiconductor substrate 10 will normally include several layers of various semiconductor materials which make up the active components of the semiconductor device. For simplicity, these layers and devices are not shown in the illustrations. Dielectric layer 12 may be any material suitable for insulating metal interconnect lines 14 from components or other materials in layers below and shown lumped together as semiconductor substrate 10.

Interconnect lines are preferably formed by depositing a layer of aluminum on a preferably planar dielectric layer 12. The aluminum may be masked with a resist, patterned and etched with one of several methods known in the art. This procedure results in the metal connecting lines 14 as shown in FIG. 2a. The method of the present invention contemplates using high aspect ratio metal, where the thickness of the interconnect metal is greater than the width. The high aspect ratio interconnects are useful to reduce line resistance while maintaining close spacing for high density circuits. Connection between the interconnects and the circuits below is represented by the via and plug 16. The number and location of vias is determined by the underlying circuit design.

FIG. 2b shows HSQ 18 applied between the interconnects 14 on the surface of the wafer. The HSQ 18 is preferably applied by spin-coat processing in sufficient thickness to fill critical areas between the metal interconnects 14, shown in FIG. 2b. The preferred material is poly hydrogen silsesquioxane (HSQ) which has a dielectric constant of less than about 3. This material is manufactured by Dow-Corning, sold under the trade name FOX, and also by Allied Signal, sold under the trade name HSSO. The HSQ is then preferably partially cured at about 300° C. by a hot plate bake on the spin-coater.

The HSQ 18 is followed by a stabilizing cap layer 20 as shown in FIG. 2b. The cap layer helps prevent the nucleation and propagation of micro cracks, allows for $O_2$ and $H_2O$ furnace curing, allows thicker HSQ layers without cracking, and improves planarization. The thickness of the cap layer can be optimized according to the strength and thickness of the HSQ. The cap layer may be dense plasma $SiO_2$, plasma $Si_3N_4$, fluorinated $SiO_2$ or other suitable dielectric. A plasma enhanced chemical vapor deposited $SiO_2$ cap layer is preferred because it uses the same CF based chemistry for etching as is used for via etch. The thickness of the cap layer is preferably about 1,000 to 3,000 Å, and most preferably about 2,000 Å.

After application of the cap layer 20 the HSQ may be cured. The cap layer helps prevent the nucleation and propagation of micro cracks, allows for $O_2$ and $H_2O$ furnace curing, allows thicker HSQ layers without cracking, and improves planarization.

The cap layer 20 may then be followed by a thick, about 16,000 Å, $SiO_2$ interlayer dielectric 22 for planarization. After planarization of the interlayer dielectric, the structure is as shown in FIG. 1. In a preferred embodiment, the interlayer dielectric is $SiO_2$ deposited by plasma enhanced chemical vapor deposition (PECVD) and planarized by chemical mechanical polishing (CMP). As further discussed below, the present invention combines the advantages of $SiO_2$ and low dielectric constant materials by placing the low dielectric material between traditional dielectric materials. Structural stability, adhesion, thermal conductivity etc. are enhanced by the $SiO_2$ or other suitable dielectric.

Figure 3:
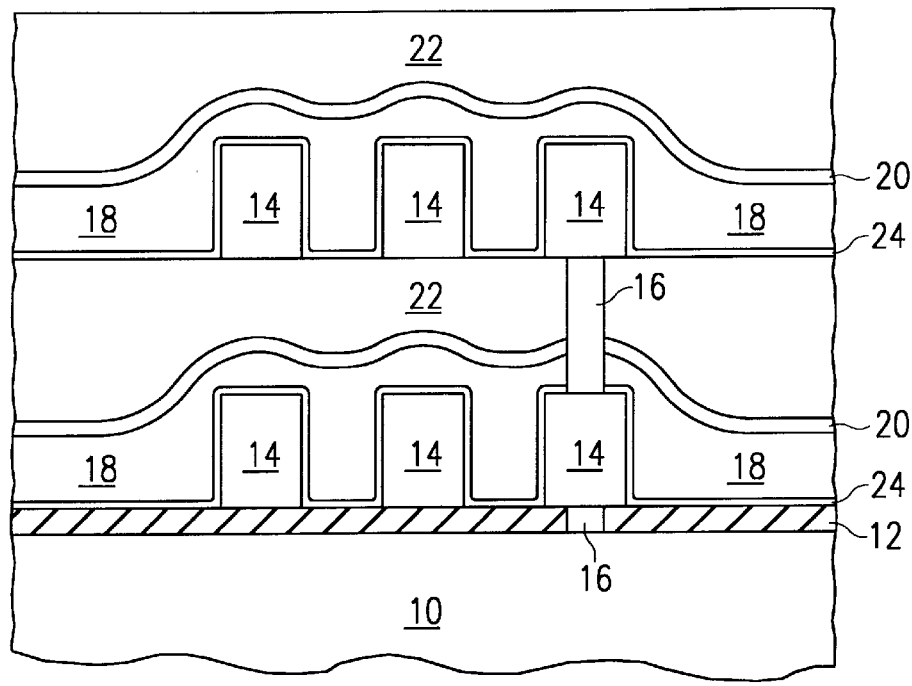
FIG. 3 Represents a cross-sectional view of a preferred embodiment of the present invention having multiple levels of interconnect lines.

The method of the present invention may be repeated to form multiple levels of interconnects stacked one upon the other. An example of multiple levels is shown in FIG. 3. Typically multiple level interconnects will necessitate vias and contacts 16 from one level to the next. These vias are usually made after the interlevel dielectric has been applied and planarized in a manner well known in the art.

FIG. 3 also shows a liner layer 24. The use of a liner layer 24 can be used to keep the HSQ from coming in contact with the interconnects 14. The liner layer may be an etch stopping or protective overcoat layer such as CVD silicon oxide. The HSQ material is then spun onto the surface of the wafer over the liner layer.

While the structure illustrated in FIG. 1 is similar to prior art structures, an important feature should be noted. The method of the present invention allows HSQ to be applied to a greater thickness than previously possible. This increased thickness can decrease interconnect capacitance by having more low dielectric constant material between metal interconnect layers, and also decrease fringing capacitance between interconnects on the same metal layer. In prior art structures using prior art methods, the maximum plane field thickness 26 was about 4,000 Å and the maximum HSQ above the interconnect 28 was about 1,000 Å. Using the methods of the prior art, HSQ applied above these maximums had significant cracking problems. An embodiment of the present invention includes a field thickness 26 of greater than 4,000 Å and the HSQ above the interconnect 28 greater than 1,000 Å.

Figure 4:
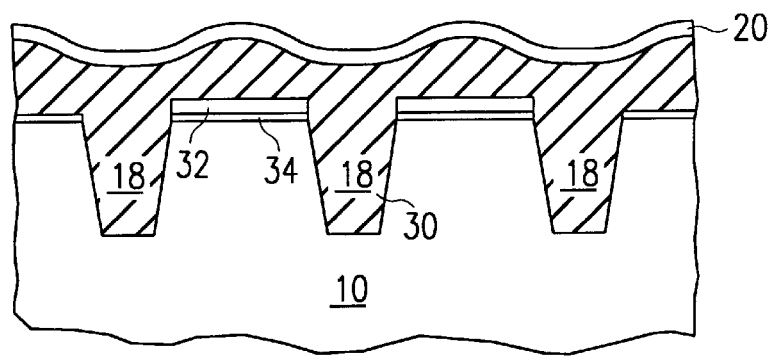
FIG. 4 Represents a cross-sectional view of another preferred embodiment of the present invention using a caped HSQ layer in trench isolation.

Another embodiment of the present invention is illustrated in FIG. 4. This embodiment applies the method of the present invention to the structure in Ser. No. 60/ (TI-19738). This application discloses a structure wherein HSQ is placed in the isolation trenches to provide a high temperature resistant trench refill. It was discovered that applying a cap layer to the HSQ prior to furnace cure is also beneficial in this structure. Specifically, the cap layer allows thicker HSQ layers without deleterious effects, increasing the possible layer thickness above 1 $\mu$m. A cap layer also allows for $O_2$ and $H_2O$ furnace curing of the HSQ and reduces shrinkage of the HSQ layer.

As illustrated in FIG. 4, a silicon substrate 10 has an isolation trench 30 to isolate adjacent active devices such as transistors 32. The nitride cap 22 is both a hardmask for trench formation etch and a CMP stop for oxide planarization. The surface of the substrate is preferably then spin-coated with HSQ 18. The HSQ 18 is then preferably partially cured by a hot plate bake on the spin-coater. A capping layer 20, preferably PETEOS, is applied as discussed above. After the capping layer is applied, the HSQ can be safely furnace cured at 1050° C. in $N_2$, $O_2$ or at 850° C. in $H_2O$. The furnace cure is preferably for 15 to 100 minutes and most preferably for about 30 minutes.

An additional embodiment of the present invention is illustrated in FIG. 5. This embodiment uses an HSQ layer for a poly metal dielectric layer. As illustrated in FIG. 5, a silicon substrate 10 has one or more gates 34. The gates may include isolation trenches 30 to isolate adjacent active devices. The surface of the substrate is preferably spin-coated with HSQ 18. The HSQ 18 is then preferably partially cured by a hot plate bake on the spin-coater. A capping layer 20, preferably PETEOS, is applied as discussed above. After the capping layer is applied, the HSQ can be safely furnace cured at 1050° C. in $N_2$, $O_2$ or at 850° C. in $H_2O$. The furnace cure is preferably for 15 to 100 minutes and most preferably for about 30 minutes. This embodiment may be used in combination with the other embodiments described above.

The present invention also contemplates using a stabilizing layer in combination with the structures and techniques disclosed in the previous co-assigned applications listed above.

The sole Table, below, provides an overview of some embodiments and the drawings.

TABLE

| Drawing Element | Preferred or Specific Examples | Generic Term | Other Alternate Examples |
|---|---|---|---|
| 10 | Silicon Substrate | Substrate or Wafer | GaAs |
| 12 | Silicon Oxide | Buffer Layer | |
| 14 | Aluminum | Interconnect Line | TiN/Al/TiN, Cu, W |
| 16 | Tungsten | Via | Aluminum |
| 18 | HSQ | Low Dielectric Constant Material | Xerogel, organic SOGs, low dielectric constant polymers |
| 20 | TEOS | Capping Layer | Fluorinated $SiO_2$, $Si_3N_4$, Diamond, or other dielectrics with good mechanical strength. |
| 22 | $SiO_2$ | Inter-metal Dielectric | Fluorinated $SiO_2$, $Si_3N_4$, Diamond, or other dielectrics with good mechanical strength. |
| 24 | Silicon Oxide | Liner | Fluorinated $SiO_2$ |
| 30 | Trench | | |
| 32 | Nitride | Polishing Stop | |
| 34 | Silicon Oxide | Pad Oxide | |

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a microelectronic structure, said method comprising steps:
    (a) providing a semiconductor substrate;
    (b) applying a layer of hydrogen silsesquioxane on said substrate;
    (c) applying a capping layer to said hydrogen silsesquioxane layer;
    (d) furnace curing the hydrogen silsesquioxane layer subsequent to applying said capping layer.

2. The method according to claim 1, wherein said hydrogen silsesquioxane is applied between interconnect lines on said substrate.

3. The method according to claim 2, further comprising the additional step of providing a liner layer over said conductive interconnect lines prior to applying said hydrogen silsesquioxane.

4. The method according to claim 1, wherein said hydrogen silsesquioxane is applied in isolation trenches on said substrate.

5. The method according to claim 1, wherein said capping layer is chosen from the group of $SiO_2$ and $S_3N_4$, and fluorinated $SiO_2$.

6. The method according to claim 1, wherein said furnace cure has an ambient from the following group of $C_xH_y$, $C_xF_y$, $N_2$, $O_2$, $H_2O$ and Forming Gas (mixture of $H_2$ and $N_2$).

7. The method according to claim 6, wherein said furnace cure has a temperature above 400° C.

8. The method according to claim 6, wherein said furnace cure has a temperature above 800° C.

9. The method according to claim 1, including the additional step of planarizing said second dielectric subsequent to deposition and then repeating steps (a) through (d) to create a multilevel interconnect structure.

10. A method of forming a microelectronic structure, said method comprising steps:
   (a) providing a semiconductor substrate having metal interconnects;
   (b) applying a layer of hydrogen silsesquioxane on said substrate over said interconnects and between said interconnects;
   (c) applying a capping layer to said hydrogen silsesquioxane layer;
   (d) furnace curing the hydrogen silsesquioxane layer subsequent to applying said capping layer.

11. The method according to claim 10, further comprising the additional step of providing an liner layer over said conductive interconnect lines prior to applying said hydrogen silsesquioxane.

12. The method according to claim 10, wherein said hydrogen silsesquioxane is applied in isolation trenches on said substrate.

13. The method according to claim 10, wherein said capping layer is chosen from the group of $SiO_2$ and $S_3N_4$, and fluorinated $SiO_2$.

14. The method according to claim 10, wherein said furnace cure has an ambient from the following group of $C_xH_y$, $C_xF_y$, $N_2$, $O_2$, $H_2O$ and Forming Gas (mixture of $H_2$ and $N_2$).

15. The method according to claim 14, wherein said furnace cure has a temperature above 400° C.

16. The method according to claim 14, wherein said furnace cure has a temperature above 800° C.

17. The method according to claim 10, including the additional step of planarizing said second dielectric subsequent to deposition and then repeating steps (a) through (d) to create a multilevel interconnect structure.

* * * * *